United States Patent [19]
Hashimoto

[11] Patent Number: 5,377,899
[45] Date of Patent: Jan. 3, 1995

[54] METHOD FOR PRODUCING SOLDER THAT CONTAINS THEREIN ADDITIVE PARTICLES MAINTAINING ITS SHAPE

[75] Inventor: Mitsuru Hashimoto, Tokyo, Japan

[73] Assignee: NEC Corporation, Tokyo, Japan

[21] Appl. No.: 188,831

[22] Filed: Jan. 31, 1994

[30] Foreign Application Priority Data

Jan. 29, 1993 [JP] Japan ................... 5-013956

[51] Int. Cl.⁶ ................ H01L 21/58; B23K 35/14
[52] U.S. Cl. ...................... 228/117; 228/18; 228/56.3; 228/176
[58] Field of Search ............ 228/18, 56.3, 117, 123.1, 228/176

[56] References Cited

U.S. PATENT DOCUMENTS

| | | | |
|---|---|---|---|
| 3,163,499 | 12/1964 | Bray | 29/191.2 |
| 3,620,880 | 11/1971 | Lemelson | 228/117 |
| 4,020,987 | 5/1977 | Hascoe | 228/56.3 |
| 4,423,120 | 12/1983 | Paulus et al. | 228/117 X |

FOREIGN PATENT DOCUMENTS

| | | |
|---|---|---|
| 2188307 | 1/1974 | France . |
| 660991 | 6/1938 | Germany ............ 228/56.3 |
| 14069 | 2/1981 | Japan . |
| 985281 | 3/1965 | United Kingdom . |
| 1017650 | 1/1968 | United Kingdom . |
| 1112693 | 5/1968 | United Kingdom . |
| 9323197 | 11/1993 | WIPO . |

Primary Examiner—Kenneth J. Ramsey
Attorney, Agent, or Firm—Sughrue, Mion, Zinn, Macpeak & Seas

[57] ABSTRACT

Of two sheet-like solder stocks, one sheet-like solder stock is fed at a constant speed, and additive particles having a constant particle diameter are spread on an upper surface of the one solder material sheet in a quantitative fixed quantity. The other sheet-like solder stock is stacked on the upper surface of the one sheet-like solder stock, and the two stacked solder stocks are rolled and integrally laminated by rollers. The laminated solder sheet is cut into a plurality of narrow solder strips. Each of the solder strips is wound on a reel, and supplied as a die bonding material capable of being used for the die bonding. Thus, if this solder is used for a semiconductor chip die bonding, the unevenness in thickness of the solder layer directly under the die-bonded semiconductor chip becomes small, and it is possible to minimize the error in the semiconductor chip recognition in the case of the wire bonding.

8 Claims, 3 Drawing Sheets

METHOD FOR PRODUCING SOLDER THAT CONTAINS THEREIN ADDITIVE PARTICLES MAINTAINING ITS SHAPE

BACKGROUND OF THE INVENTION

1. Field of the Invention

The present invention relates to a method for producing a solder containing additive particles therein.

2. Description of Related Art

In the prior art, a minute amount of copper has been added into a solder in order to improve a strength and creep characteristics.

As a solder material for bonding a semiconductor chip on a bonding substrate, there has been developed a solder for soldering between parts in such a manner that the shape of additive particles is maintained as it is and therefore a desired spacing is uniformly ensured between the parts by action of the additive particles (For example, JP-A-56-014069).

In order to produce a solder containing therein this type of additive particles, as shown in FIG. 1, additive particles 5 are added from an additive particle supplying vessel 7 into a molten solder material 1 within a molten solder bath 9, and the solder material 1 and the additive particles 5 are sufficiently stirred and mixed at a high temperature.

Thereafter, a molten solder material 1 mixed with the additive particles 5 is teemed from an opening of the molten solder bath 9, and caused to pass a cooling tunnel 6 so that the molten solder material 1 is cooled and solidified. Then, the solidified solder material is rolled by a pair of rollers 2 to a solder material sheet 3 having a predetermined thickness, and further, the solder material sheet 3 is cut into a plurality of narrow solder strips having a predetermined width. Finally, each of the narrow solder strips is wound on a reel 4 by a predetermined length.

In the conventional method as mentioned above, however, in the case of the additive particles formed of a low melt point metal such as Cu powder and Cu/Ag coated powder, the additive particles 5 are molten into the molten solder within the high temperature molten solder bath 9 in the course of the stirring and mixing process, and therefore, the additive particles cannot keep their original shape. In addition, in the case of the additive particles 5 such as Ni powder, Mo powder, W powder, glass beads, BN powder, etc, having a specific gravity lighter than that of the solder material, the additive particles are separated from and floated on the solder material 1 within the molten solder bath 9. On the other hand, in the case of the additive particles 5 having a specific gravity heavier than that of the solder material, the additive particles settle within the molten solder bath 9. In both cases, the distribution of the additive particles 5 within the solder material 1 becomes nonhomogeneous. For example, the content of the additive particles in the finished solder has varied in the range of 0 weight % to 0.5 weight %.

This solder is not suitable as a material for bonding between the semiconductor chip and the die bonding substrate. For example, not only it becomes difficult to control a solder layer to a desired thickness, but also the thickness of the solder layer directly under the semiconductor chip becomes uneven, and therefore, the semiconductor chip is bonded on the bonding substrate in an inclined condition. For example, the unevenness in thickness of the solder layer on the die bonding substrate has reached 30 μm at maximum. As a result, an adverse influence affects a semiconductor chip recognition in the case of a wire bonding.

SUMMARY OF THE INVENTION

Accordingly, it is an object of the present invention to provide method for producing a solder, which has overcome the above mentioned defect of the conventional one.

Another object of the present invention is to provide a method for producing a solder, which is capable of distributing additive particles in the solder with less uneven distribution in plane, at a constant density, regardless of physical property and electrical characteristics, while keeping an original shape of the additive particles.

The above and other objects of the present invention are achieved in accordance with the present invention by a method for producing a solder by laminating two sheets of solder material so as to form a solder used for bonding a semiconductor chip onto a die bonding substrate, the method including:

a spreading step for feeding one of the solder material sheets at a constant speed, and for spreading a constant amount of additive particles having a constant particle diameter on an upper surface of the one solder material sheet, and a rolling and laminating step for stacking the other of the solder material sheets on the upper surface of the one solder material sheet where the additive particles have been spread and for rolling the stacked solder material sheets so that the stacked solder material sheets are integrally laminated.

According, to another aspect of tile present invention, there is provided a method for producing a solder by laminating two sheets of solder material so as to form a solder used for bonding a semiconductor chip onto a die bonding substrate, the method including:

a spreading step for feeding one of the solder material sheets at a constant speed and for jetting additive particles having a constant particle diameter on an upper surface of the one solder material sheet so that the additive particles are at least partially buried into the one solder material sheet and a constant amount of additive particles are distributed on the upper surface of the one solder material sheet, and a rolling and laminating step for stacking the other of the solder material sheets on the upper surface of the one solder material sheet where the additive particles have been spread, so that the additive particles are sandwiched between the two stacked solder material sheets, and for rolling the stacked solder material sheets so that the stacked solder material sheets are integrally laminated.

Since a constant amount of additive particles are distributed on a bonding surface of one of the two rolled solder material sheets and are sandwiched between the two rolled solder material sheets, the additive particles are added into the solder material while maintaining its original shape, with less uneven distribution in plane, at a constant density by volume, regardless of physical property and electrical characteristics of the additive particles.

Preferably, the additive particles have a melt point higher than that of the solder material and a heat conductivity more excellent than the solder material, and are formed of insulating material particles or insulating material particles having their surface coated with an electrically conductive metal.

According to still another aspect of the present invention, there is provided a system for producing a solder by laminating two sheets of solder material so as to form a solder used for bonding a semiconductor chip onto a die bonding substrate, the system containing: second sheet-like solder stock;

a first section for supplying a first sheet-like solder stock and a a second section for distributing a constant amount of additive particles having a constant particle diameter on an upper surface of the first solder stock while feeding the first solder stock at a constant speed;

a third section for stacking the second solder stock on the upper surface of the first solder stock and for rolling the two stacked solder stocks so that the two stacked solder stocks becomes an integrally laminated solder sheet having the additive particles at a constant content while substantially maintaining an original shape of the additive particles.

Preferably, the system further includes a fourth section for cutting the laminated solder sheet into a plurality of narrow solder strips; and a fifth section for winding each of the solder strips on a reel.

The above and other objects, features and advantages of the present invention will be apparent from the following description of preferred embodiments of the invention with reference to the accompanying drawings.

DESCRIPTION OF THE PREFERRED EMBODIMENTS

Figure 1:
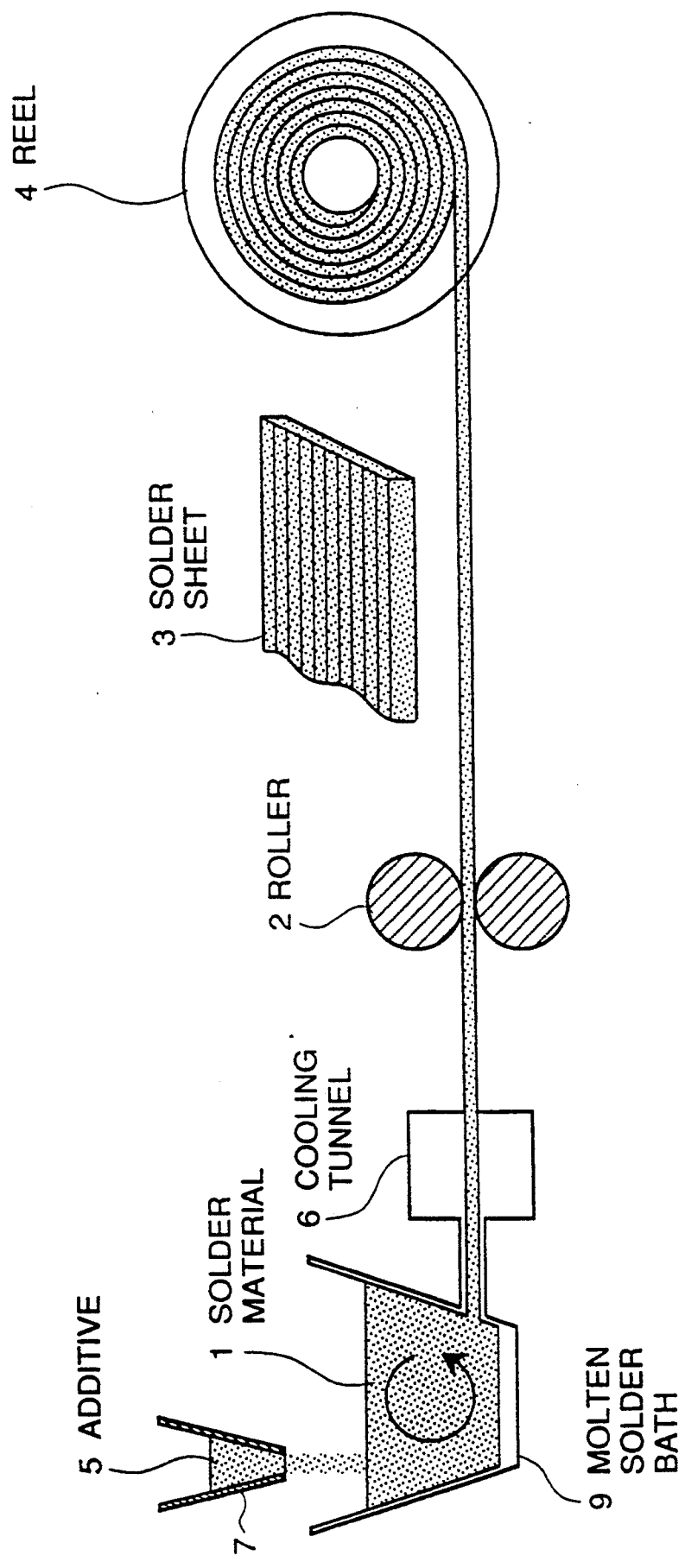
FIG. 1 is a diagram for illustrating a solder producing process of the prior art.
Figure 2:
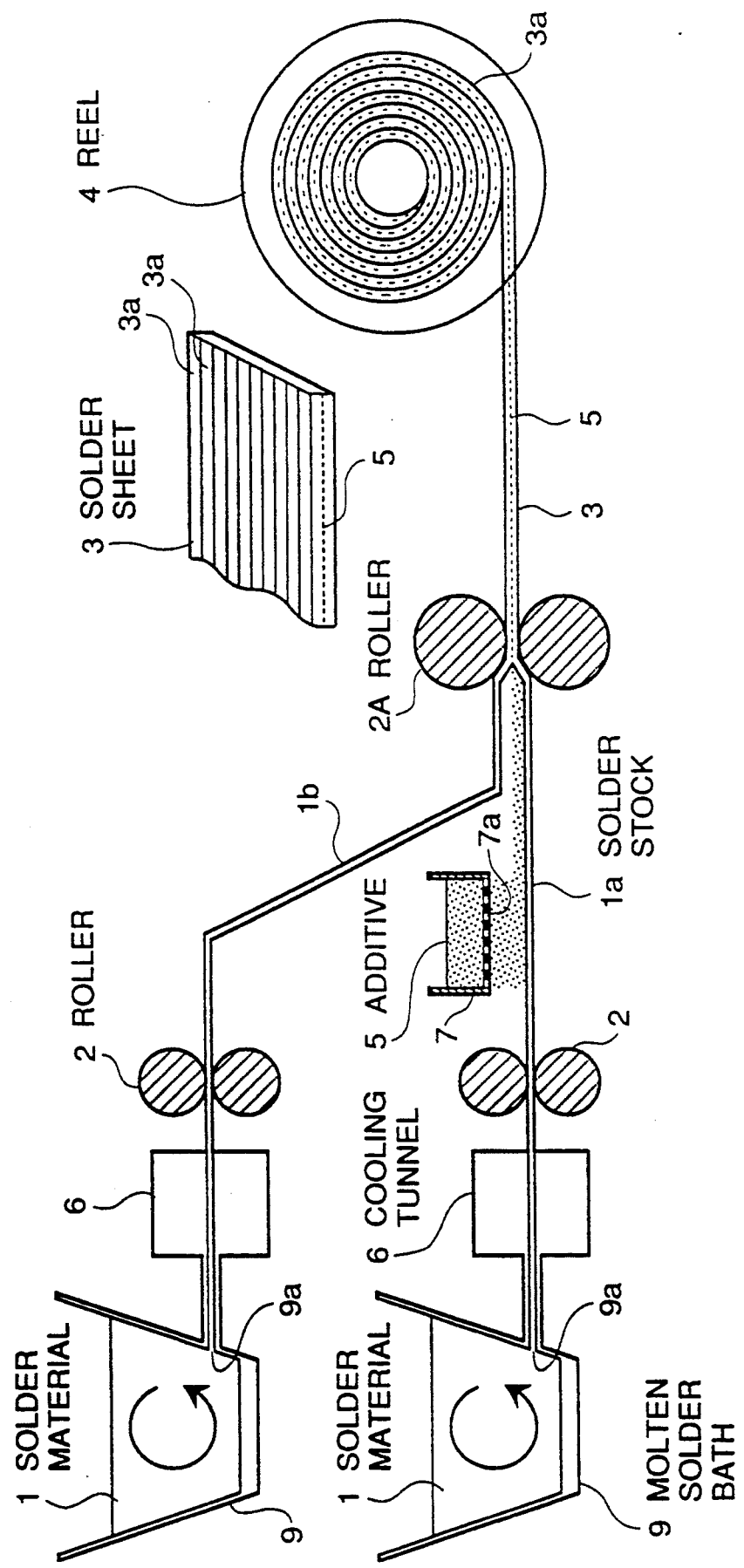
FIG. 2 is a diagram for illustrating a first embodiment of the solder producing process in accordance with the present invention.

FIG. 2 is a diagram for illustrating a first embodiment of the solder producing process in accordance with the present invention.

As shown in FIG. 2, the first embodiment of the solder producing process in accordance with the present invention includes a stirring step A, a cooling and rolling step B, an additive spreading step C, a rolling and laminating step D, a cutting step E and a winding step F.

In the stirring step A as shown in FIG. 2, there are provided two molten solder baths 9 and 9 in each of which a starting solder material 1 is stirred.

In the cooling and rolling step B, a cooling tunnel 6 and a pair of rollers 2 are provided to each of the molten solder baths 9 and 9. The stirred solder material 1 is teemed in the form of a sheet from an opening 9a formed at a side wall of each of the molten solder baths 9 and 9, and then, is caused to pass through the corresponding cooling tunnel 6 so that it is cooled and solidified. Then, the cooled sheet-like solder material is rolled by the pair of rollers 2 to a solder stock having a predetermined thickness. Thus, two sheet-like solder stocks 1a and 1b to be laminated to each other are continuously formed. Here, one of the two sheet-like solder stocks 1a and 1b, namely, the sheet-like solder stock 1a is fed to the next additive spreading step C at a constant speed.

In the additive spreading step C, there is provided an additive particle supplying vessel 7 configured to spread additive particles 5 in a quantitative fixed quantity onto an upper surface of the sheet-like solder stock 1a which is fed at the constant speed.

Here, the additive particles 5 preferably have their particle diameter on the order of 10 μm to 30 μm and their melt point higher than that of the solder stocks 1a and 1b. In addition, the additive particles have an excellent heat conductivity and are formed of insulating material particles or insulating material particles coated with an electrically conductive metal. Furthermore, the spreading of the additive particles is performed for example by causing the additive particles 5 to pass and fall through a sieve 7a formed at a bottom of the additive particle supplying vessel 7 (gravity falling or natural falling) on the upper surface of the sheet-like solder stock 1a which is fed at the constant speed. At this time, the spreading amount of the additive particles is preferably determined so that the content of the additive particles 5 in the finished solder is in the range of 0.02 weight % to 0.1 weight %.

In the rolling and laminating step D, a pair of rolling rollers 2A are provided. The other sheet-like solder stock 1b is stacked onto the upper surface of the sheet-like solder stock 1a on which the additive particles 5 have been spread, so that the additive particles 5 are sandwiched between the two sheet-like solder stocks 1a and 1b. The stacked sheet-like solder stocks 1a and 1b are caused to pass between the pair of rollers 2 so that the stacked sheet-like solder stocks 1a and 1b are rolled and integrally laminated. Thus, a solder sheet 3 containing the additive particles 4 sandwiched between the two laminated sheet-like solder stocks 1a and 1b while maintaining the original shape of the additive particles 4, is finished. Here, the two stacked sheet-like solder stocks 1a and 1b are not necessarily required to be the same in sheet thickness.

In the cutting step E, the solder sheet 3 finished by sandwiching the additive particles 4 between the two laminated sheet-like solder stocks 1a and 1b, is cut into a plurality of narrow strips 3a.

In the winding step F, each of the narrow solder strips 3a is individually wound on a corresponding individual reel 4 by a required length.

Thus, the solder strip 3a containing therein the additive particles 5 at a uniform content while maintaining its original shape can be produced.

Figure 3:
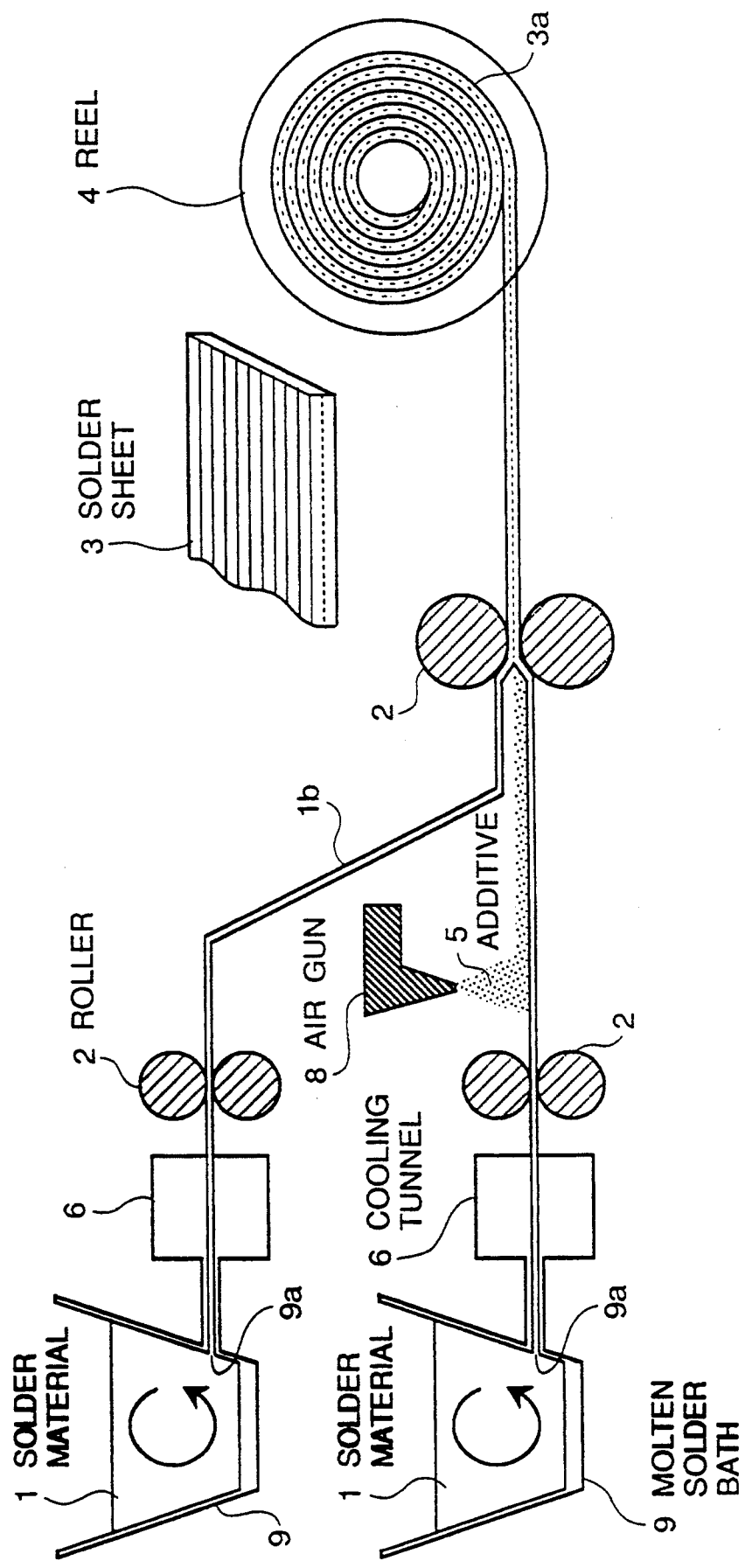
FIG. 3 is a diagram for illustrating a second embodiment of the solder producing process in accordance with the present invention.

FIG. 3 is a diagram for illustrating a second embodiment of the solder producing process in accordance with the present invention.

The embodiment shown in FIG. 3 is different from the Embodiment 1 shown in FIG. 2, only in the additive spreading step C. Namely, in the additive spreading step C of this embodiment, an air gun 8 is provided, so that the additive particles 8 are jetted from the air gun 8 onto the upper surface of the sheet-like solder stock 1a, so that a portion of the jelled additive particles 5 are forcibly buried into the sheet-like solder stock 1a, and the other portion of the jetted additive particles 5 are deposited or adhered on the upper surface of the sheet-like solder stock 1a. Thus, a quantitative fixed quantity of additive particles 5 are uniformly distributed on the upper surface or the sheet-like solder stock 1a.

According to this second embodiment, since the additive particles 5 are forcibly buried into the upper surface of the sheet-like solder stock 1a, it is possible to increase the efficiency of fixing the additive particles 5 between the two sheet-like solder stocks 1a and 1b.

As mentioned above, the method of the present invention can control the content of the additive particles in the range of 0.02 weight % to 0.1 weight %, maintaining the original shape of the additive particles, differently from the prior art in which the content of the additive particles varies in the range of 0 weight % to 0.5 weight %. In addition, the additive particles can be selected without being limited in the physical property and electrical characteristics. In the case of the die bonding, furthermore, since the additive particles are uniformly included directly under the semiconductor chip, the unevenness in thickness of the solder layer located on the die bonding,, substrate is reduced to 5 μm at maximum from 30 μm at maximum of the prior art. Therefore, it is possible to minimize the error in the semiconductor chip recognition in the case of the wire bonding, and also it is possible to advantageously control a solder layer to a desired thickness.

The invention has thus been shown and described with reference to the specific embodiments. However, it should be noted that the present invention is in no way limited to the details of the illustrated structures but changes and modifications may be made within the scope of the appended claims.

I claim:

1. A method for producing a solder by laminating two sheets of solder material so as to form a solder used for bonding a semiconductor chip onto a die bonding substrate, the method including:
   a spreading step for feeding one of said solder material sheets at a constant speed, and for spreading a constant amount of additive particles having a constant particle diameter on an upper surface of said one solder material sheet, and
   a rolling and laminating step for stacking the other of said solder material sheets on the upper surface of said one solder material sheet where the additive particles have been spread and for rolling the stacked solder material sheets so that the stacked solder material sheets are integrally laminated.

2. A method claimed in claim 1 wherein said additive particles have a melt point higher than that of said solder material and a heat conductivity more excellent than said solder material, and are formed of insulating material particles or insulating material particles having their surface coated with an electrically conductive metal.

3. A method claimed in claim 1 wherein said spreading step is performed by causing said additive particles to pass and fall through a sieve formed at a bottom of an additive particle supplying vessel so that said additive particles are spread by a gravity falling on the upper surface of said one sheet-like solder stock which is fed at the constant speed.

4. A method for producing a solder by laminating two sheets of solder material so as to form a solder used for bonding a semiconductor chip onto a die bonding substrate, the method including:
   a spreading step for feeding one of said solder material sheets at a constant speed and for jetting additive particles having a constant particle diameter on an upper surface of said one solder material sheet so that the additive particles are at least partially buried into said one solder material sheet and a constant amount of additive particles are distributed on the upper surface of said one solder material sheet, and
   a rolling and laminating step for stacking the other of said solder material sheets on the upper surface of said one solder material sheet where the additive particles have been spread, so that said additive particles are sandwiched between the two stacked solder material sheets, and for rolling said stacked solder material sheets so that the stacked solder material sheets are integrally laminated.

5. A method claimed in claim 4 wherein said additive particles have a melt point higher than that of said solder material and a heat conductivity more excellent than said solder material, and are formed of insulating material particles or insulating material particles having their surface coated with an electrically conductive metal.

6. A method claimed in claim 4 wherein said spreading step is performed by use of an air gun for jetting said additive particles having a constant particle diameter on said upper surface of said one solder material sheet.

7. A system for producing a solder by laminating two sheets of solder material so as to form a solder used for bonding a semiconductor chip onto a die bonding substrate, the system containing:
   a first section for supplying a first sheet-like solder stock and a second sheet-like solder stock;
   a second section for distributing a constant amount of additive particles having a constant particle diameter on an upper surface of said first solder stock while feeding said first solder stock at a constant speed;
   a third section for stacking said second solder stock on the upper surface of said first solder stock and for rolling the two stacked solder stocks so that the two stacked solder stocks becomes an integrally laminated solder sheet having said additive particles at a constant content while substantially maintaining an original shape of said additive particles.

8. A system claimed as claim 7, further including:
   a fourth section for cutting said Laminated solder sheet into a plurality of narrow solder strips; and
   a fifth section for winding each of said solder strips on a reel.

* * * * *